United States Patent [19]

Yata

[11] Patent Number: 4,615,960
[45] Date of Patent: Oct. 7, 1986

[54] INSOLUBLE AND INFUSIBLE SUBSTRATE WITH A POLYACENE-TYPE SKELETAL STRUCTURE, AND ITS APPLICATIONS FOR ELECTRICAL CONDUCTOR OR ORGANIC CELL

[75] Inventor: Shizukuni Yata, Hyogo, Japan

[73] Assignee: Kanebo, Ltd., Tokyo, Japan

[21] Appl. No.: 690,799

[22] Filed: Jan. 11, 1985

[30] Foreign Application Priority Data

Jan. 19, 1984 [JP] Japan ................................. 59-8152
Feb. 10, 1984 [JP] Japan ................................ 59-24165

[51] Int. Cl.⁴ ..................... H01M 4/60; H01M 10/40; H01B 1/20
[52] U.S. Cl. .................................. 429/194; 252/500; 429/213
[58] Field of Search ...................... 429/123, 194, 197; 252/500, 518; 357/8

[56] References Cited

U.S. PATENT DOCUMENTS 4,375,427 3/1983 Miller et al. ........................ 429/213
4,442,187 4/1984 MacDiarmid et al. ............. 429/213
4,472,489 9/1984 Maxfield et al. .................... 429/213

FOREIGN PATENT DOCUMENTS 82105230.5 6/1982 European Pat. Off. .

Primary Examiner—Donald L. Walton
Attorney, Agent, or Firm—Flynn, Thiel, Boutell & Tanis

[57] ABSTRACT

An insoluble and infusible substrate with a polyacene-type skeletal structure having a hydrogen/carbon atomic ratio of from 0.05 to 0.60 and a specific surface area, measured by the BET method, of at least 600 m²/g, said substrate being a heat-treated product of an aromatic condensation polymer consisting of carbon, hydrogen and oxygen.

The substrate provides an electrically conductive organic polymeric material having a higher electrical conductivity than said non-doped substrate, when it is doped with an electron donating doping agent, or an electron accepting doping agent, or both.

The substrate is useful as an electrode for organic cell.

31 Claims, 1 Drawing Figure

INSOLUBLE AND INFUSIBLE SUBSTRATE WITH A POLYACENE-TYPE SKELETAL STRUCTURE, AND ITS APPLICATIONS FOR ELECTRICAL CONDUCTOR OR ORGANIC CELL

BACKGROUND OF THE INVENTION

1. Field of the Invention

This invention relates to an insoluble and infusible substrate with a polyacen-type skeletal structure, an electrically conductive organic polymeric material obtained by doping the aforesaid substrate with a doping agent, and to an organic cell comprising the aforesaid material as an electrode and a solution in an aprotic organic solvent of a compound capable of forming dopant ions as an electrolytic solution.

2. Description of the Prior Art

Polymeric materials have excellent moldability, light weight and mass-producibility. It has been desired therefore in the electronics industry and many other industrial fields to produce electrically semiconductive or conductive organic polymeric materials by utilizing these excellent properties. It is especially desired to produce organic polymeric semiconductors or conductors which have an electrical conductivity in the range of semiconductors or conductors, possess the properties of n-type or p-type semiconductors as in inorganic semiconductors such as silicon and germanium, and can be applied to diodes, transistors, solar cells, etc. by utilizing their p-n junction.

Early organic polymeric semiconductors or conductors were limited in application because they were difficult to mold into films or sheets and did not have the properties of n-type or p-type extrinsic semiconductors. Recent advances in technology have resulted in the production of organic polymeric materials having the properties of n-type or p-type semiconductors, which have relatively good moldability and can be formed into molded articles, and of which electrical conductivity can be greatly increased by doping them with an electron donating dopant or an electron accepting dopant. Polyacetylene and polyphenylene are known as examples of such organic polymeric materials.

For example, "Gosei Kinzoku" Kagaku Zokan ("Synthetic Metals", Chemistry, special issue) No. 87, pages 15 to 28, 1980 discloses that by polymerizing acetylene, polyacetylene (having an electrical conductivity of $10^{-9}$ to $10^{-5}$ $ohm^{-1}cm^{-1}$) in film form is directly obtained, and by doping it with an electron donating dopant or an electron accepting dopant, an n-type or p-type semiconductor having a greatly increased electrical conductivity can be obtained. Polyacetylene, however, has the defect of being susceptible to oxidation by oxygen. For example, when polyacetylene is left to stand in air, it gradually absorbs oxygen and increases in weight, and with it, turns black brown and finally pale yellow. The rapidity of this oxidation reaction depends upon the crystallinity of polyacetylene. For example, even powdery polyacetylene having a relatively good crystallinity prepared with a $Ti(O-n-C_4H_9)_4$-$Al(C_2H_5)_3$ catalyst system changes in composition to $(CHO_{0.18})_x$ and drastically decreases in electrical conductivity when it is left to stand in air at room temperature for 2,000 hours. Thus, despite its excellent electrical conductivity, polyacetylene has poor oxidation stability and finds little practical application.

Japanese Laid-Open Patent Publication No. 129443/1980 discloses that an n-type or p-type semiconductor having a greatly increased electrically conductivity can be produced by press-forming polyphenylene (an insulator having an electrical conductivity of about $10^{-12}$ $ohm^{-1}cm^{-1}$) obtained by oxidative cationic polymerization of benzene, and doping the resulting molded articles of polyphenylene with an electron donating dopant or an electron accepting dopant. Unlike polyacetylene, polyphenylene has the advantage of possessing relatively good oxidation stability. Since, however, phenylene moieties are linked linearly by single bonds in polyphenylene, a conjugated system between carbon atoms is underdeveloped and there seems to be a limit in the level of its electrical conductivity which can be achieved by using a doping agent. Also, there seems to be a limit to the controllability of electrical properties by a doping agent. In fact, when polyphenylene is doped, for example, with halogen (an electron accepting dopant), the degree of its increase in electrical conductivity is smaller than that of polyacetylene doped with the same amount of halogen. Even when polyphenylene is doped with halogen in the largest dopable amount, its electrical conductivity does not increase beyond $10^{-7}$ $ohm^{-1}cm^{-1}$ (see Example 5 of the above-cited Japanese patent document).

In recent years, electronic devices and appliances have strikingly been reduced in size, thickness or weight, and with it, it has been increasingly desired to build electric cells in small size and thickness and light weight. Presently, silver oxide cells are in widespread use as small-sized electric cells of good performance. Thin dry cells or small-sized light-weight lithium cells of high performance have been developed and come into commercial acceptance. Since, however, they are primary cells, they cannot be used for long periods of time by repeated charging and discharging. On the other hand, nickel-cadmium cells have been used as secondary cells of high performance, but are still unsatisfactory in realizing small size, small thickness and light weight.

Lead storage cells have been used in various industrial fields as secondary cells of a large capacity. The greatest defect of these storage cells is their large weight. This is inevitable, however, since lead peroxide and lead are used as electrodes. In recent years, attempts have been made to decrease their sizes and improve their performance for use in electric automobiles, but have not resulted in practical cells. There has been a strong demand, however, for light-weight secondary cells of a large capacity as storage cells.

The cells now in commercial acceptance have their own advantages and disadvantages and are used selectively according to the desired uses.

To fill the present-day need for smaller sizes, smaller thicknesses and lighter weights, a cell has recently been developed which contains an electrode active substance obtained by doping a thin film of polyacetylene, an organic semiconductor, with an electron donating or accepting substance (see the specification of Japanese Laid-Open Patent Publication No. 136469/1981 corresponding to U.S. Pat. Nos. 4,321,114 and 4,442,187 and European Laid-Open Patent Publications Nos. 36118 and 124702). This cell is a secondary cell of high performance and could be rendered thinner and lighter. But it has the defect that the polyacetylene as an organic semiconductor is very unstable, and readily undergoes oxidation by oxygen in the air or degeneration by heat. This cell should therefore be produced in an atmosphere of an inert gas, and there is also a restriction in the molding of polyacetylene into a shape suitable as an electrode.

Usually, secondary cells are required to have a high electromotive voltage, a high charge efficiency and energy efficiency in charging and discharging, a high energy density and power density per unit weight, a long service life, and freedom from maintenance and be low in cost.

SUMMARY OF THE INVENTION

It is an object of this invention to provide a novel insoluble and infusible substrate with a polyacene-type skeletal structure which has a high surface area and exhibits excellent oxidation stability as well as excellent physical properties.

Another object of this invention is to provide an insoluble and infusible substrate of the aforesaid properties which can give an excellent electrically conductive organic polymeric material by doping with an electron donating or accepting doping agent.

Still another object of this invention is to provide an insoluble and infusible substrate with a polyacene-type skeletal structure which has a high specific surface area and can be used suitably as an electrode of an organic electrolytic cell containing an electrolytic solution composed of a solution in an aprotic organic solvent of a compound capable of forming dopant ions by electrolysis.

Still another object of this invention is to provide an insoluble and infusible substance of a high specific surface area which can be doped at a high doping speed and also with a doping agent having a large ionic radius.

Still another object of this invention is to provide an electrically conductive organic polymeric material which exhibits excellent oxidation stability in addition to having the electrical conductivity of a semiconductor or conductor and excellent physical properties.

Still another object of this invention is to provide an electrically conductive organic polymeric material comprising a substrate of an insoluble and infusible material having a polyacene-type skeletal structure with a developed conjugated system between carbon atoms and an electron donating dopant or an electron accepting dopant.

Still another object of this invention is to provide an electrically conductive organic polymeric material having the properties of a p-type or n-type extrinsic semiconductor.

Still another object of this invention is to provide a secondary cell of high performance comprising the aforesaid insoluble and infusible substrate with a polyacene-type skeletal structure as an electrode.

Still another object of this invention is to provide a secondary cell having a high electromotive voltage, a high coulombic efficiency and energy efficiency in charging and discharging and a high energy density and power density per unit weight.

Still another object of this invention is to provide a secondary cell which has a long service life and is maintenance-free.

Still another object of this invention is to provide a secondary cell which is easy to build in small size or thickness.

Still another object of this invention is to provide a secondary cell which is easy to produce and low in cost.

Further objects and advantages of this invention will become apparent from the following description.

According to this invention, these objects and advantages are achieved firstly by an insoluble and infusibe substrate with a polyacene-type skeletal structure having a hydrogen/carbon atomic ratio of from 0.05 to 0.60 and a specific surface area, measured by the BET method, of at least 600 $m^2/g$, said substrate being a heat-treated product of an aromatic condensation polymer consisting of carbon, hydrogen and oxygen.

According to this invention, the above objects and advantages are achieved secondly by an electrically conductive organic polymeric material comprising (a) an insoluble and infusible substrate with a polyacene-type skeletal structure having a hydrogen/carbon atomic ratio of from 0.15 to 0.60 and a specific surface area measured by the BET method of at least 600 $m^2/g$, said substrate being a heat-treated product of an aromatic condensation polymer consisting of carbon, hydrogen and oxygen, and (b) an electron donating doping agent, or an electron accepting doping agent, or both, said material having a higher electrical conductivity than the non-doped substrate (a).

According to this invention, the above objects and advantages are achieved thirdly by an organic cell comprising a positive electrode, a negative electrode and an electrolytic solution, one or both of said positive and negative electrodes being composed of an insoluble and infusible substrate with a polyacene-type skeletal structure having a hydrogen/carbon atomic ratio of from 0.05 to 0.50 and a specific surface area, measured by the BET method, of at least 600 $m^2/g$, said substrate being a heat-treated product of an aromatic condensation polymer consisting of carbon, hydrogen and oxygen, and said electrolytic solution being a solution in an aprotic organic solvent of a compound capable of forming ions which can dope said electrodes by electrolysis.

BRIEF DESCRIPTION OF THE ACCOMPANYING DRAWING

FIG. 1 is a view for roughly illustrating the structure of the cell of this invention.

DETAILED DESCRIPTION OF THE INVENTION

Figure 1:
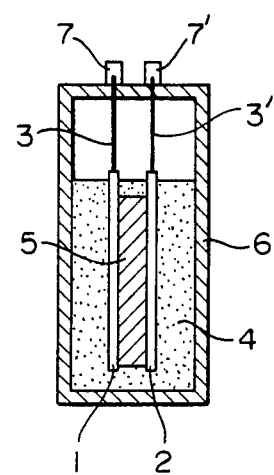

The insoluble and infusible substrate, electrically conductive organic polymeric material and organic cell in accordance with this invention will be described in detail below.

The insoluble and infusible substrate of this invention can be produced, for example, by the following method from an aromatic condensation polymer consisting of carbon, hydrogen and oxygen.

First, the aromatic condensation polymer is mixed with an inorganic material such as zinc chloride, sodium phosphate, potassium hydroxide or potassium sulfide. The mixing may be effected, for example, by dissolving the aromatic condensation polymer in a solvent such as methanol, acetone or water, adding the inorganic material to the solution, and mixing them fully. When the aromatic condensation polymer is fusible as in the case of a novolak resin, the mixing may be carried out under heat. The mixing ratio of the aromatic condensation polymer to the inorganic material differs depending upon the types of the polymer and the inorganic material. Preferably, the weight ratio of the aromatic condensation polymer to the inorganic material is from 100:5 to 100:900. The mixture is then molded into a desired form, for example a film, a plate, a fiber, a cloth or a composite of these, and then cured. The method of molding naturally differs depending upon the final desired form. For example, a fiber may be obtained by spinning, and a film, by using an applicator. A plate-like material may be obtained by press-forming in a mold. The molded article may be cured by heating it at a temperature of 50° to 180° C. for 2 to 60 minutes, or heating it at 50° to 150° C. in the presence of a curing agent and a catalyst for 2 to 90 minutes. Subsequently, the cured molded article is heated in a non-oxidizing atmosphere at 350° to 800° C., preferably 420° to 800° C.

The heat-treatment conditions differ somewhat depending upon the type of the aromatic condensation polymer, the degree of the curing treatment or the shape of the polymeric article. Generally, the temperature can be raised from room temperature to about 300° C. at a relatively high rate, for example at 100° C./hour. When the temperature exceeds 300° C., the aromatic condensation polymer begins to decompose thermally to evolve gases such as water vapor ($H_2O$), hydrogen, methane and carbon monoxide. Therefore, to more than 300° C., the temperature is advantageously raised at a sufficiently slow rate. For example, in the case of a non-porous molded article, the hydrogen/carbon atomic ratio of the resulting insoluble and infusible substrate can be easily controlled by adjusting the rate of temperature elevation to $80/h^2$ (°C./hour) wherein h is the thickness (mm) of the molded article. Furthermore, by so adjusting the temperature elevation rate, it is easy to stabilize the electrical conductivity, specific surface area and mechanical properties.

The resulting heat-treated product is fully washed with hot water at 50° to 100° C. to remove the inorganic material such as zinc chloride or sodium phosphate used in the starting mixture, and dried.

As a result, an insoluble and infusible substrate is formed which has a hydrogen/carbon atomic ratio of from 0.05 to 0.6 and a specific surface area, measured by the BET method, of at least 600 $m^2/g$. This substrate has a polyacene-type skeletal structure, and is of a structure permitting incoming and outgoing of electrolyte ions smoothly by an electrochemical method as will be shown hereinbelow. In the X-ray diffraction ($CuK_\alpha$ radiation) of the substrate, the main peak is observed at $2\theta = 22°$ or less in all regions where the hydrogen/carbon atomic ratio is from 0.05 to 0.6. This fact shows that the planar polyacene-type molecules constituting the substrate of this invention have a very broad average interplanar spacing. This is presumably the reason why it has a specific surface area, by BET method, of as high as at least 600 $m^2/g$.

U.S. patent application Ser. No. 386,816 filed June 9, 1982 and European patent application No. 82105230.5 disclose an insoluble and infusible substrate having a polyacene skeletal structure, but neither describe nor suggest one having a specific surface area of at least 600 $m^2/g$.

Suitable aromatic condensation polymers consisting of carbon, hydrogen and oxygen are condensation products formed between aromatic hydrocarbon compounds having a phenolic hydroxyl group and aldehydes.

Phenols such as phenol, cresol and xylenol are suitable as the aromatic compounds, but these are not limitative examples. There can also be used methylenebisphenols of the following formula

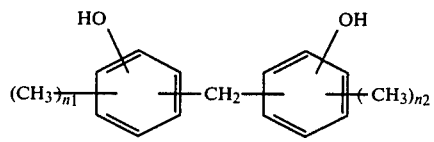

wherein $n_1$ and $n_2$ may be the same or different, and are integers of 0 to 2, hydroxy-biphenyls and hydroxynaphthalenes. For practical purposes, phenols, especially phenol, are preferred.

Examples of the aldehydes are formaldehyde, acetaldehyde and furfural. Formaldehyde is preferred.

The phenol-formaldehyde condensate may be a novolak, a resol or a mixture of these.

According to this invention, a modified aromatic condensation polymer obtained by using an aromatic hydrocarbon free from a phenolic hydroxyl group, such as xylene or toluene, in place of a part of the aromatic hydrocarbon having a phenolic hydroxyl group, can also be used as the aromatic condensation polymer consisting of carbon, hydrogen and oxygen. There can also be used an aromatic condensation polymer corresponding to a condensate of an aromatic compound containing an oxygen atom as a hetero atom and an aldehyde, such as a condensate of furfuryl alcohol corresponding to a condensate of furan and formaldehyde.

Advantageously, the aromatic condensation polymer consisting of carbon, hydrogen and oxygen is heat-treated after it is molded into fibers, a film, a plate, or a composite of these.

The aromatic condensation polymers as such have a hydrogen/carbon atomic ratio of usually at least 0.9 and scarcely below 0.8.

The insoluble and infusible substrate of this invention having a hydrogen/carbon atomic ratio (to be sometimes referred to as H/C) is especially suitable for production of electrically conductive organic polymeric materials when its H/C is 0.15 to 0.60, preferably 0.25 to 0.5, and particularly for use in organic cells when its H/C is 0.05 to 0.5.

The electrical conductivity of the insoluble and infusible substrate of this invention differs depending upon the H/C atomic ratio. For example, when its H/C is 0.6, it has an electrical conductivity of not more than $10^{-11}$ $ohm^{-1} cm^{-1}$. When its H/C is 0.15, it is a semiconductor having an electrical conductivity of about $10^{-2}$ $ohm^{-1} cm^{-1}$. When the above substrate is doped with an electron donating or accepting dopant, its electrical conductivity increases greatly to provide an n-type or p-type semiconductor.

Since the insoluble and infusible substrate of this invention having a polyacene-type skeletal structure has a specific surface area, measured by the BET method, of as high as 600 $m^2/g$, it is anticipated that gases such as oxygen will readily enter and degrade it. In fact, contrary to the anticipation, the substrate of this invention remains substantially unchanged in properties, etc. even when left to stand in the air for a long period of time. For example when it is left to stand in the air for 1000 hours, no change occurs in electrical conductivity and it still retains its excellent oxidation stability.

The electrically conductive organic polymeric material is produced by doping the insoluble and infusible substrate of this invention with an electron donating or accepting doping agent.

Doping agents which are generally known can be used as the electron donating or accepting doping agents.

Substances which readily liberate electrons are used as the electron donating dopants. Preferred examples are metals of Group IA of the periodic table such as lithium, sodium, potassium, rubidium and cesium.

Substances which readily accept electrons are used as the electron accepting dopants. Preferred examples are halogens such as fluorine, chlorine, bromine and iodine, halogen compounds such as $AsF_5$, $PF_5$, $BF_3$, $BCl_3$ and $BBr_3$, oxides of non-metallic elements such as $SO_3$ or $N_2O_5$, and inorganic acids such as $H_2SO_4$, $NHO_3$ and $HClO_4$.

Substantially the same method as the doping methods previously used for polyacetylene or polyphenylene can be used to dope the substrate of this invention with such dopants.

When the dopant is an alkali metal, the substrate can be doped by contacting it with a molten alkali metal or a vapor of the alkali metal. Or the insoluble and infusible substrate can be contacted with an alkali metal-naphthalene complex formed in tetrahydrofuran.

When the dopant is a halogen, a halogen compound or a non-metallic element oxide, the substrate can be easily doped by contacting it with a gas of such a dopant.

When the dopant is an anion derived from an inorganic acid, the substrate can be doped by coating or impregnating it directly with the inorganic acid, or by performing electrolysis in an electrolytic solution containing the inorganic acid using the substrate as an anode.

Generally, the doping agent is used such that it exists in the resulting organic polymeric material of this invention in a proportion of at least $10^{-5}$ mole per recurring unit of the aromatic condensation polymer.

Thus, the organic polymeric material of this invention has a higher electrical conductivity than the insoluble and infusible substrate before the doping, preferably 10 times or more as high as the latter. By suitable methods, the electrical conductivity of the resulting organic polymeric material of this invention is $10^3$ to $10^6$ times or more as high as that of the non-doped substrate.

When the H/C atomic ratio exceeds 0.60, the conjugated system of electrons is considered to be localized because the polyacene-type skeletal structure of the polymer has not yet grown. At such a ratio, the substrate does not increase in electrical conductivity even when doped with the dopant, and it does not become an n-type or p-type semiconductor. When the H/C atomic ratio is less than 0.15, the polyacene-type skeletal structure is grown fully, and the conjugated system of electrons is fully non-localized, and the substrate can be doped with the doping agent. However, since the substrate itself before doping has a considerably high electrical conductivity, the contribution of the doping to the electrical conductivity is little, and the electrical conductivity of the doped substrate is not so much higher than the non-doped sub- strate.

Since the insoluble and infusible substrate of this invention having a polyacene-type skeletal structure has a specific surface area, measured by the BET method, of as high as at least 600 m$^2$/g, the doping speed is large and a substrate having a large thickness can be doped within a short period of time. Furthermore, the substrate can be doped smoothly with a doping agent having a large ionic radius such as $ClO_4^-$ and $BF_4^-$. For example, let us assume that the substrate is electrolytically doped with $ClO_4^-$ ions in a propylene carbonate solution of metallic Li/LiClO$_4$ (1 mole/liter/substrate). If the specific surface area of the substrate is not more than 500 m$^2$/g, the doping is difficult to perform while maintaining a potential of 4 V between the metallic lithium and the substrate. With the substrate of this invention having a specific surface area of at least 600 m$^2$/g, however, the $ClO_4^-$ ion can be fully introduced into the substrate at this potential.

The electrically conductive organic polymeric material doped with the electron donating dopant has the electrical conductivity of an n-type (electron excessive type) semiconductor or conductor. The electrically conductive organic polymeric material of this invention doped with the electron accepting dopant has the electrical conductivity of a p-type (hole excessive type) semiconductor or conductor.

According to this invention, the electron donating dopant and the electron accepting dopant may be used in combination as the dopant. When these doping agents are present together uniformly, the doped substrate becomes p-type or n-type by one of these doping agents which is present in a larger amount. For example, if the electron donating dopant is present in a larger amount, the substrate becomes n-type. If the electron accepting dopant is present in a larger amount, the substrate becomes p-type. The electrically conductive organic polymeric material having a mixture of the doping agents can be produced by contacting the insoluble and infusible substrate with a mixture of the dopants, or by contacting it with one of the doping agents, and then with the other.

An electrically conductive organic polymeric material having a so-called p-n junction is also within the scope of this invention. Such a material can be produced by doping the insoluble and infusible substrate with the electron donating dopant from one side and the electron accepting doping agent from the other; or by doping the entire surface of the substrate with one of the doping agents and then doping only a part of the doped surface with the other dopant.

The electrically conductive organic polymeric material obtained by this invention preferably has a dc conductivity at room temperature of at least $10^{-4}$ ohm$^{-1}$cm$^{-1}$.

As is clear from the foregoing description, the electrically conductive organic polymeric material of this invention is given in the form of a molded article such as a film, a fiber, a plate or a composite of these.

The organic cell of this invention comprises the insoluble and infusible substrate of this invention as at least one electrode and a solution in an aprotic organic solvent of a compound capable of forming ions which can dope the electrode by electrolysis.

Heat-treated products of condensation products of aromatic hydrocarbon compounds having a phenolic hydroxyl group and aldehydes, above all a heat-treated product of a condensation product of phenol and formaldehyde, are suitably used as the insoluble and infusible substrate.

The hydrogen/carbon atomic ratio of the insoluble and infusible substrate having a polyacene-type skeletal structure is from 0.05 to 0.5, preferably from 0.1 to 0.35. If the atomic ratio is less than 0.05, the coulombic efficiency of a secondary cell built by using the substrate in charging and discharging is not satisfactory, and the energy density is reduced. On the other hand, if the atomic ratio is more than 0.5, the coulombic efficiency during charging or discharging becomes poor.

The specific surface area, measured by the BET method, of the insoluble and infusible substrate is at least 600 m$^2$/g. If it is less than 600 m$^2$/g, it is necessary to increase the charging voltage at the time of charging a secondary cell produced by using the substrate as an electrode. Consequently, the energy efficiency is reduced, and the electrolytic solution will be degraded.

The shape of the insoluble and infusible substrate of this invention used as an electrode can be freely selected depending upon the performance, size, shape, etc. of the desired cell. For example, it is preferably in the form of a film, a sheet, a fiber, a nonwoven fabric, a woven fabric, a plate or a porous plate. The free selectability of the shape of the insoluble and infusible substrate as an electrode depending upon the purpose of use is one characteristic of this invention. Electrodes of various shapes cannot be obtained from conventional known electrically conductive organic polymeric materials such as polyacetylene or poly-p-phenylene.

Examples of the compound capable of forming ions which can dope the electrode include the halides, perchlorates, hexafluorophosphates, hexafluoroarsenates and tetrafluoroborates of alkali metals or tetraalkyl ammoniums. Specific examples are LiI, NaI, NH$_4$I, LiClO$_4$, LiAsF$_6$, LiBF$_4$, KPF$_6$, NaPF$_6$, (C$_2$H$_5$)$_4$NClO$_4$, (n-C$_4$H$_9$)$_4$NClO$_4$, (n-C$_4$H$_9$)$_4$NAsF$_6$, (n-C$_4$H$_9$)$_4$NPF$_6$ and LiHF$_2$.

Examples of the aprotic organic solvent for dissolving the aforesaid compounds include ethylene carbonate, propylene carbonate, gamma-butyrolactone, dimethyl formamide, dimethyl acetamide, dimethyl sulfoxide, acetonitrile, dimethoxyethane, tetrahydrofuran, methylene chloride and mixtures of these. The solvent is selected by considering the solubility of the compound used as an electrolyte, the performance of the cell, etc.

The concentration of the aforesaid compound in the electrolytic solution is preferably at least 0.1 mole/liter in order to reduce the internal resistance by the electrolytic solution. Usually, it is more preferably from 0.2 to 1.5 moles/liter.

The cell of this invention comprises the insoluble and infusible substrate having a polyacene-type skeletal structure as a positive electrode and/or a negative electrode and an electrolytic solution composed of a solution of the dopant in the aprotic organic solvent. Its activity utilizes the electrochemical doping and electrochemical undoping of the substrate with dopants. In other words, the energy is stored or released outside by electrochemical doping of the substrate with the dopant, or released outside or stored inside as an electrical energy by electrochemical undoping.

The cell in accordance with this invention can be divided roughly into two types. A first type is a cell in which the insoluble and infusible substrate is used both as a positive and a negative electrode. A second type is a cell in which the insoluble and infusible substrate is used as a positive electrode and an electrode composed of an alkali metal or its alloy as a negative electrode.

The shape and size of the electrode composed of the insoluble and infusible substrate disposed within the cell may be properly selected depending upon the desired cell. But since the cell reaction is an electrochemical reaction on the surface of the electrode, the electrode advantageously has as high a surface area as possible.

The insoluble and infusible substrate, either doped or non-doped, may be used as a current collector for taking out an electric current from the substrate out of the cell. Other electrically conductive materials having corrosion resistance to the doping agents and the electrolytic solution, such as carbon, platinum, nickel and stainless steel, may also be used as the collector.

With reference to the accompanying drawing, one embodiment of the cell of this invention will be described below. In the drawing, the reference numeral 1 represents a positive electrode; 2, a negative electrode; 3 and 3', a current collector; 4, an electrolytic solution; 5, a separator; 6, a casing; and 7 and 7', an outside terminal.

The first type of the cell of this invention in which both the positive and negative electrodes are made of the insoluble and infusible substrate will first be described. The positive electrode 1 is made of the insoluble and infusible substrate having the shape of a film, cloth or plate, which may be doped or non-doped. The negative electrode 2 is the insoluble and infusible substrate having the shape of a film, cloth or plate, which may be doped or non-doped. After the cell is built, a voltage is applied to it from an external power supply to dope the substrate with the doping agent. For example, when both electrodes are made of the non-doped insoluble and infusible substrate, the electromotive voltage of the cell after building is 0 V. By applying a voltage to it from an external power supply and doping both electrodes with the doping agent, the cell gains an electromotive force. The current collectors 3 and 3' serve to take out a current outside from the electrodes or supply a current for electrochemical doping, namely for charging. They are connected respectively to the electrodes and the external terminals 7 and 7' in such a manner as not to cause a decrease in voltage. The electrolytic solution 4 is a solution in the aprotic organic solvent of the aforesaid compound capable of forming ions which can dope the electrodes. The electrolytic solution is usually liquid, but to prevent leakage, it may be used in the form of a gel or a solid. The separator 5 is disposed to prevent contact between the positive and negative electrodes and to hold the electrolytic solution. The separator 5 is preferably made of an open-cellular porous material which is electrically non-conductive and has durability to the electrolytic solution, the dopants, and electrode active substances such as alkali metals. It may be a cloth, non-woven cloth, a porous material, etc. composed of glass fibers, polyethylene, polypropylene, etc. To decrease the internal resistance of the cell, the separator is preferably as thin as possible. Its thickness, however, is determined by considering the amount of the electrolytic solution held, its permeability, strength, etc. The positive and negative electrodes and the separators are fixed in position within the casing 6 in a manner not to give rise to any problem in use. The shape, size, etc. of the electrode may be properly determined according to the shape and performance of the desired cell. For example, to produce a thin cell, the electrode is preferably in the form of a film or cloth. A cell of a large capacity may be produced by alternately stacking a plurality of positive and negative electrodes in the form of a film, cloth or plate.

Now, the second-type cell in accordance with this invention in which the positive electrode 1 is made of the insoluble and infusible substrate and the negative electrode 2 is made of an alkali metal or its alloy will be described.

Examples of the alkali metal are cesium, rubidium, potassium, sodium and lithium. Lithium is most preferred.

In FIG. 1, the positive electrode 1 is made of the insoluble and infusible substrate, and the negative electrode 2 is formed of an alkali metal or its alloy. The second-type cell has either one of the following two doping mechanisms, i.e. cell operating mechanisms. One of them is a mechanism in which the doping of the insoluble and infusible substrate with the electron accepting dopant corresponds to charging and the undoping of it corresponds to discharging. For example, when the non-doped insoluble and infusible substrate and lithium are used and a propylene carbonate solution of $LiClO_4$ (1 mole/liter) is used as the electrolytic solution, the cell after building has an electromotive voltage of 2.5 to 3.0 V. When a voltage is applied to it from an external power supply to dope the insoluble and infusible substrate with $ClO_4^-$ ions, the electromotive voltage of the cell becomes 3.5 and 4.5 V.

The other is a mechanism in which the doping of the insoluble and infusible substrate with the electron donating dopant corresponds to discharging and its undoping corresponds to charging. For example, with the aforesaid cell construction, the electromotive voltage of the cell after building is 2.5 to 3.0 V. When the insoluble and infusible substrate is doped with lithium ions by discharging a current outside, the electromotive voltage becomes 1.0 to 2.5 V. When the lithium ions are removed by applying a voltage by an external power supply, the electromotive voltage again becomes 2.5 to 3.0 V.

The doping or undoping may be carried out at a constant current, or at a constant voltage or at varying currents and voltages. The amount of the dopant to dope the insoluble and infusible substrate is preferably 0.5 to 20% in terms of the percentage of the number of ions added per carbon atom of the substrate.

The cell including the insoluble and infusible substrate as an electrode is a secondary cell capable of being repeatedly charged and discharged. Its electromotive voltage varies with the structure of the cell. With the first type, it is 1.0 to 3.5 V, and with the second type, it is 3.5 to 4.5 V (one having the first mechanism) and 2.5 to 3.0 V (one having the second mechanism).

The cell of this invention has a high energy density per unit weight, and if it is doped to a suitable extent, its energy density reaches 100 to 350 WH/kg. The power density of the cell of the invention is much higher than that of lead storage cells, although there is a difference depending upon the structure of the cell.

Furthermore, since the insoluble and infusible substrate of this invention is a very stable substance, the cell of this invention can be repeatedly charged and discharged and does not decrease in performance over an extended period of time.

The cell of this invention comprises an electrode active substance obtained by doping with the electron donating or accepting substance the insoluble and infusible substrate with a polyacen-type skeletal structure, which has superior oxidation resistance, heat resistance and moldability to conventional known organic semiconductors, as an electrode, and a solution in the aprotic organic solvent of the compound capable of forming ions which can dope the electrode by electrolysis. It can be reduced in size, thickness and weight and has a high capacity, a high power and a long service life.

The following examples illustrate the present invention in greater detail.

EXAMPLE 1

(a) A solution prepared by mixing a resol-type phenolic resin (as an aqueous solution with a concentration of about 65%), water and zinc chloride in a weight ratio of 10:2:5 was poured onto a glass plate, and then spread by an applicator. It was then dried in air for about 30 minutes, and cured at about 100° C. for 20 minutes while still adhering to the glass plate. Then, the resin film was removed from the glass plate to obtain a film having a thickness of about 200 microns. The film was put in an electric furnace having silicon carbide heating elements and heat-treated to each of the predetermined temperatures shown in Table 1 at a temperature elevating rate of about 40° C./hour. This film-like heat-treated product was washed with hot water at 100° C. for about 5 hours to remove zinc chloride remaining in it. After washing, the film was dried under reduced pressure at 60° C. for 3 hours to obtain an insoluble and infusible film-like substrate.

When the film-like substrate was analyzed by fluorescent X-ray analysis, it was found to contain less than 0.01% by weight of Zn and less than 0.5% by weight of Cl based on its weight, and zinc chloride hardly remained in the substrate. X-ray diffraction analysis of the substrate showed the existence of a main peak at $2\theta=20°-22°$, and a small peak at $2\theta=41°-46°$, and thus led to the determination that the substrate had a polyacene-type skeletal structure.

The elemental analysis of the substrate was carried out, and its electrical conductivity and BET specific surface area were measured. The results are summarized in Table 1.

(b) Lithium perchlorate was dissolved in fully dehydrated propylene carbonate to form a solution having a concentration of about 1.0 mole/liter. The resulting solution was used as an electrolytic solution, and lithium metal and the film-like substrate were used as a negative electrode and a positive electrode, respectively. A voltage of about 4 V was applied across the electrodes to dope the film-like substrate with $ClO_4^-$ ions. The amount of doping is expressed as the number of $ClO_4^-$ ions per carbon atom in the substrate. In the present invention, the number of $ClO_4^-$ ions was determined from the current which flowed in the circuit during the doping.

The above procedure gave a film composed of an electrically conductive polymeric material doped with the $ClO_4^-$ ions. After the doping, the electrically conductive polymeric film was taken out, washed with acetone, and subsequently dried under reduced pressure at 60° C. for about 60 minutes. Then, its electrical conductivity was measured. The results are shown in Table 1.

The BET specific surface area was measured by a method involving adsorption of a gaseous mixture of nitrogen and helium by using a device (MONOSORB, made by Yuasa Aioniksu Co., Ltd.) (the same method was used in subsequent examples).

TABLE 1

| Run No. | Heat-treating temperature (°C.) | H/C atomic ratio | Electrical conductivity of the substrate (ohm$^{-1}$cm$^{-1}$) | BET Specific surface area (m$^2$/g) | Amount of doping of ClO$_4$ (%) | Electrical conductivity after doping (ohm$^{-1}$cm$^{-1}$) |
|---|---|---|---|---|---|---|
| 1 | 400 | 0.55 | below 10$^{-12}$ | 650 | 1.2 | 10$^{-5}$ |
| 2 | 450 | 0.43 | 10$^{-10}$ | 830 | 1.5 | 10$^{-4}$ |
| 3 | 500 | 0.28 | 10$^{-5}$ | 870 | 1.8 | 10$^{-1}$ |
| 4 | 550 | 0.22 | 10$^{-4}$ | 970 | 1.2 | 10$^0$ |
| 5 | 600 | 0.18 | 10$^{-3}$ | 920 | 1.2 | 10$^0$ |
| 6 | 670 | 0.15 | 10$^{-2}$ | 850 | 1.2 | 10$^1$ |

It is seen from Table 1 that the substrates having a hydrogen/carbon atomic ratio (H/C) of 0.15 to 0.6 had a specific surface area of more than 600 m$^2$/g, and increased greatly in electrical conductivity when doped with ClO$_4^-$ ions.

COMPARATIVE EXAMPLE 1

(a) A plain-weave cloth (Kynol, a trade name for a product of Nippon Kynol Co.,. Ltd.; a basis weight of 200 g/m$^2$) of phenolic fibers was immersed in a 40% by weight methanol solution of a resol-type phenolic resin, and squeezed by a mangle to adhere the resol-type phenol resin. The cloth was then dried at room temperature for 24 hours to form a prepreg in which the weight ratio of the phenolic fibers to the resol-type phenolic resin was 1:1. The prepreg was cured under a pressure of 150 kg/cm$^2$ for 30 minutes by a press forming machine heated at 150° C. to obtain a plate having a thickness of 250 microns. The plate was heat-treated in a nitrogen atmosphere to 300° C. at 70° C./hour and further to 600° C. at a rate of 10° C./hour. The non-doped heat-treated plate had an H/C atomic ratio of 0.31. X-ray diffraction of the plate showed the presence of a main peak at $2\theta=22.5°$ and another peak in the vicinity of $2\theta=41°-46°$, and led to the determination that the plate had a polyacene-type skeletal structure. The heat-treated plate was powderized. Its specific surface area was measured by the BET method and found to be 450 m$^2$/g.

(b) A plate having a thickness of about 200 microns (dimension 1×1 cm; a comparative substrate) composed of the heat-treated product shown in (a) above and the substrate of Run No. 3 having an H/C atomic ratio of 0.28 shown in Example 1 (size 1×1 cm; the substrate of the invention) were doped with ClO$_4^-$ ions by the same method as shown in Example 1. When the substrate of Run No. 3 of Example 1 was used as a positive electrode, a current of about 5 mA was observed at a voltage of 4V between the two electrodes. In about 1 hour, it became 0.1 mA, and the ClO$_4^-$ ion doping was completed. The doped sample was then taken out, washed with acetone, and dried under reduced pressure. The sample was subjected to EPMA (electron probe X-ray microanalysis), and the distribution of the ClO$_4^-$ ions in the cut section of the sample was examined. It was determined that the perchlorate ions were distributed uniformly from its surface to interior.

Then, the heat-treated product (comparative substrate) having a specific surface area of 450 m$^2$/g produced by the method shown in (a) of Comparative Example 1 was used as a positive electrode and an attempt was made to dope it with perchlorate ions at a voltage of 4V between the two electrodes. Hardly any current flowed in the circuit. The doping was continued in this state for about 3 hours, but hardly any current was observed in the circuit. The sample was taken out, washed with acetone, dried under reduced pressure and subjected to EPMA analysis. The perchlorate ions were observed only on the very surface of the sample.

EXAMPLE 2

The sample of Run No. 2 of Example 1 having an H/C atomic ratio of 0.43 and a BET specific surface area of 830 m$^2$/g (thickness about 200 microns, the substrate of the invention) and the sample shown in Comparative Example 1 having an H/C atomic ratio of 0.31 and a BET specific surface area of 450 m$^2$/g (thickness about 200 microns, comparative substrate) were each doped with iodine.

The substrate of the invention was put in a vacuum line, and after adjusting the degree of vacuum to less than 10$^{-2}$ torr, iodine gas as introduced into the line at room temperature to start doping. The electrical conductivity of the substrate of the invention before doping was about 10$^{-10}$ ohm$^{-1}$cm$^{-1}$, and became 2×10$^{-4}$ ohm$^{-1}$cm$^{-1}$ in 2 minutes after the start of doping, 1×10$^{-3}$ ohm$^{-1}$cm$^{-1}$ after the lapse of 5 minutes and about 2×10$^{-3}$ ohm$^{-1}$cm$^{-1}$ after the lapse of 10 minutes. The sample as taken out, washed with acetone, dried under reduced pressure at room temperature and subjected to EPMA analysis. It was found that the sample as nearly uniformly doped with iodine to its interior.

The comparative substrate was then put into a vacuum line, and after adjusting the degree of vacuum to less than 10$^{-2}$ torr, an attempt was made to dope the substrate with iodine at about 200° C. In about 30 minutes, its electrical conductivity increased to 10$^5$ times. The sample as taken out, washed with acetone, dried under reduced pressure at room temperature and subjected to EPMA analysis. It was found that iodine penetrated to a depth of about 40 microns from the surface of the sample.

It was thus confirmed that the substrate of this invention having a thickness of as large as 200 microns could be doped at a very high speed.

EXAMPLE 3

The film-like substrate of Run No. 3 of Example 1 having an H/C atomic ratio of 0.28 and a BET specific surface area of 870 m$^2$/g was immersed in a tetrahydrofuran solution of sodium naphthalate prepared by using dehydrated tetrahydrofuran, naphthalene and metallic sodium in a dry box (N$_2$ atmosphere) to attempt to dope it with sodium. After immersion for about 30 minutes, the substrate was washed with dehydrated tetrahydrofuran, and dried under reduced pressure at room temperature. The electrical conductivity of the sample was measured and found to be about 10$^0$ ohm$^{-1}$cm$^{-1}$ which increased greatly from that (about 10$^{-5}$ ohm$^{-1}$cm$^{-1}$)

of the non-doped sample. EPMA analysis showed that the sample was doped with sodium to its interior.

EXAMPLE 4

(a) A solution prepared by mixing a resol-type phenolic resin (as an aqueous solution with a concentration of about 65%), water and zinc chloride in a weight ratio of 10:2:5 was poured onto a glass plate, and then spread by using an applicator. It was then dried in air for about 30 minutes, and cured at about 100° C. for 20 minutes while still adhering to the glass plate. Then, the resin film was removed from the glass plate to obtain a film having a thickness of about 200 microns. The resin film was put in an electric furnace having silicon carbide heating elements and heat-treated to each of the predetermined temperatures shown in Table 1 at a temperature elevating rate of about 40° C./hour. This film-like heat-treated product was washed with hot water at 100° C. for about 5 hours to remove zinc chloride remaining in it. After washing, the film was dried under reduced pressure at 60° C. for 3 hours to obtain an insoluble and infusible film-like substrate.

Fluorescent X-ray analysis showed that the film-like substrate contained less than 0.01% by weight of Zn and less than 0.5% by weight of Cl based on its weight, and zinc chloride hardly remained in the substrate. X-ray diffraction analysis of the substrate indicated the existence of a main peak at $2\theta = 20°-22°$, and a small peak at $2\theta = 41°-46°$, and thus led to the determination that the substrate had a polyacene-type skeletal structure.

The elemental analysis of the substrate was carried out, and its electrical conductivity and BET specific surface area were measured. The results are summarized in Table 2.

(b) LiClO$_4$ was dissolved in fully dehydrated propylene carbonate to prepare a solution with a concentration of about 1.0 mole/liter. A cell of the type shown in FIG. 1 was built by using lithium metal as a negative electrode, the solution prepared as an electrolytic solution, and the film-like substrate as a positive electrode. A platinum mesh was used as a current collector and a felt made of glass fibers, as a separator.

In FIG. 1, the reference numeral represents a positive electrode; 2, a negative electrode; 3 and 3', a current collector; 4, an electrolytic solution; 5, a separator; 6, a casing; and 7 and 7', an outside terminal.

This cell operates on the second type mechanism described hereinabove. In other words, doping of the substrate with perchlorate ions as an electron accepting dopant corresponded to charging, and its undoping, to discharging. The amount of doping was expressed as the number of ions doped per carbon atom in the substrate. In the present invention, the number of ions introduced was determined from the current which flowed in the circuit during doping.

The voltage of the cell immediately after building is shown in Table 2.

Then, a voltage was applied to the cell from an external power supply, and the insoluble and infusible substrate was doped with perchlorate ions for 3.5 hours at a fixed current so that the amount of doping per hour became 1%. The open circuit voltage after the doping is shown in Table 2.

Then, undoping was carried out by passing a fixed current through the circuit so that the amount of undoping per hour became 1%. The undoping was continued until the open circuit voltage became equal to the voltage immediately after building the cell. The percentage of the amount of undoping based on the amount of doping in the above test is also shown in Table 2 as the coulombic efficiency.

TABLE 2

| Run No. | Heat-treating temperature (°C.) | H/C atomic ratio | Electrical conductivity of the substrate (ohm$^{-1}$cm$^{-1}$) | BET specific surface area (m$^2$/g) | Open circuit voltage after cell building (V) | Open circuit voltage after doping (V) | Coulombic efficiency (%) |
|---|---|---|---|---|---|---|---|
| 1 | 400 | 0.55 | below 10$^{-12}$ | 650 | 2.6 | 3.7 | 25 |
| 2 | 450 | 0.43 | 10$^{-10}$ | 830 | 2.7 | 3.7 | 75 |
| 3 | 500 | 0.28 | 10$^{-5}$ | 870 | 2.8 | 3.8 | 86 |
| 4 | 550 | 0.22 | 10$^{-4}$ | 970 | 2.9 | 3.9 | 96 |
| 5 | 670 | 0.15 | 10$^{-2}$ | 850 | 3.0 | 4.0 | 87 |
| 6 | 740 | 0.07 | 10$^{-1}$ | 820 | 3.0 | 4.1 | 82 |

It is seen from Table 2 that in the case of the substrate (No. 1) having a hydrogen/carbon atomic ratio of more than 0.5, the percentage of the amount of undoping based on the amount of doping was small, and the coulombic efficiency was low.

Comparative Example 2

By the same method as shown in Example 4, (b), a charging and discharging test was conducted using the plate-like substrate having a thickness of about 200 microns composed of the heat-treated product of Comparative Example 1, (a) (comparative substrate) and the substrate of Run No. 3 having a hydrogen/carbon atomic ratio of 0.28 shown in Example 4 (the substrate of the invention).

A cell built by using the substrate of Run No. 3 of Example 4 (the substrate of the invention) as a positive electrode showed a voltage of 2.8 V immediately after building. A voltage was applied to the cell from an external power supply so that the amount of doping per hour became 1%. Thus, the substrate was doped with perchlorate ions for about 6 hours. At this time, the open circuit voltage was 3.9 V. Then, the perchlorate ions were undoped so that the amount of undoping per hour became 1%. In about 5 hours, the open circuit voltage became 2.8 V, and therefore, the discharging stopped. The energy density of this cell was about 250 WH/kg. In determining the energy density, the sum of the weight of the doped insoluble and infusible substrate and the weight of the consumed lithium metal was used as a basis.

A cell was built by using the heat-treated substrate of Comparative Example 1, (a) having a specific surface area of 450 m$^2$/g (comparative substrate) as a positive electrode. Immediately after building, this cell showed a voltage of 2.8 V. The cell was charged in the same way as above for about 6 hours at a fixed current so that the amount of doping per hour became 1%. Then, the cell was subjected to a discharging test by undoping. When the discharging current was such that the amount of undoping per hour was 1%, the voltage drastically dropped. Therefore, the test was conducted so that the amount of undoping became 0.2% per hour. But the voltage still dropped drastically, and the coulombic efficiency could not be determined.

EXAMPLE 5

(a) A cured resin film prepared in the same way as in Example 4 from a solution obtained by mixing a resol-type phenolic resin (as an about 65% aqueous solution), water and zinc chloride in a weight ratio of 10:2:7. The film was heat-treated to 670° C. in a nitrogen stream to obtain an insoluble and infusible substrate. The resulting substrate had a hydrogen/carbon atomic ratio of 0.12 and a BET specific surface area of 1,050 m$^2$/g.

(b) A cell was constructed by using the film-like insoluble and infusible substrate (about 30 mg) as a positive electrode, lithium metal as a negative electrode and a solution of 1.0 mole/liter propylene carbonate solution of LiClO$_4$ as an electrolytic solution. A voltage of about 4.5 V was applied to the cell from an external power supply to dope the substrate with perchlorate ions and charge the cell. Immediately after the application of voltage, a current of about 50 mA was observed. As the time elapsed, the current decreased, and reached about 2 mA in about 20 minutes. Charging was stopped at this point. A motor (about 0.03W) was connected to the cell to perform discharging. The motor began to rotate at a high speed and stopped in about 10 hours. Immediately after the start of discharging, a current of more than 20 mA flowed, and in several seconds, the current reached about 12 mA. It continued to flow at this current value for about 10 minutes.

After the stopping of the motor, the cell was again charged for 20 minutes by applying a voltage of 4.5 V from an external power supply. Then, the motor was connected and the discharging was again carried out. The variations in the current value during charging and discharging, the state of rotation of the motor and the motor rotating time were nearly the same as those given above. This charging-discharging test was repeated 10 times, but scarcely any variation occurred in the charging and discharging characteristics, and the motor rotated similarly.

EXAMPLE 6

(n-C$_4$H$_9$)$_4$NClO$_4$ was dissolved in tetrahydrofuran to prepare a solution having a concentration of about 0.3 mole/liter. A cell was constructed by using the resulting solution as an electrolytic solution, and a positive and a negative electrode both composed of the substrate of Run No. 4 of Example 4 having a hydrogen/carbon atomic ratio of 0.22, and subjected to a charging-discharging test.

Immediately after building, the cell showed an open circuit voltage of 0 V. Then, the cell was charged by applying a voltage from an external power supply to dope the positive electrode with ClO$_4$$^-$ ions and the negative electrode with (n-C$_4$H$_9$)$_4$N$^+$ ions. The charging was carried out for about 2 hours at such a charging speed that the amount of doping per hour became 1%. At this time, the open circuit voltage was about 1.8 V. Then, at nearly the same speed as the charging speed, the undoping of ClO$_4$$^-$ ions and (n-C$_4$H$_9$)$_4$N$^+$ ions was carried out to perform discharging. In about 1.5 hours, the open circuit voltage became 0 V.

EXAMPLE 7

LiI was dissolved in fully dehydrated propylene carbonate to prepare a solution having a concentration of about 0.1 mole/liter. A cell was constructed by using the resulting solution as an electrolytic solution and a positive and a negative electrode composed of the insoluble and infusible substrate of Run No. 3 of Example 4 having a hydrogen/carbon atomic ratio of 0.28.

Immediately after construction, the cell had an open circuit voltage of 0 V. The cell was then charged by applying a voltage from an external power supply to dope the positive electrode with iodine ions and the negative electrode with lithium ions. The charging was carried out for about 1.5 hours at such a charging speed that the amount of doping per hour became 0.5%. At this time, the cell had an open circuit voltage of 1.1 V. Then, the iodine ions and lithium ions were undoped to perform discharging. The discharging was carried out at a speed about one-half of the charging speed. In about 2 hours, the open circuit voltage became 0 V.

EXAMPLE 8

A cell was constructed by using the substrate of Run No. 5 of Example 4 having a hydrogen/carbon atomic ratio of 0.15 and lithium metal as electrodes and a 1.0 mole/liter propylene carbonate solution of LiClO$_4$ as an electrolytic solution. Immediately after construction, the cell showed an open circuit voltage of 3.0 V. Then, a fixed current was passed through the circuit at such a discharging speed that the amount of doping per hour became 0.5%, thereby to dope the insoluble and infusible substrate with lithium ions. In about 6 hours, the open circuit voltage became 1.9 V. Then, by applying a voltage from an external power supply, the lithium ions was undoped from the insoluble and infusible substrate at such a charging speed that the amount of undoping became about 1%. In about 2.5 hours, the open circuit voltage became 2.8 V.

EXAMPLE 9

(a) A solution prepared by mixing a resol-type phenolic resin (as an about 65% aqueous solution), water and zinc chloride in a weight ratio of 10:5:25 was poured onto a glass plate, and spread by an applicator. It was then cured at 100° C. for 30 minutes to obtain a film having a thickness of about 200 microns. The film was heat-treated in an electrical furnace having silicon carbide heating elements in an atmosphere of nitrogen by elevating the temperature to 550° C. at a rate of about 20° C./hour. The film-like heat-treated product was washed with hot water at 100° C., and dried under reduced pressure. The film-like substrate had a hydrogen/carbon atomic ratio, determined from its elemental analysis values, of 0.23 and a BET specific surface area of 1,500 m$^2$/g.

(b) A cell was constructed by using a positive and a negative electrode composed of the resulting film-like substrate and a 1.0 mole/liter propylene carbonate solution of (C$_2$H$_5$)$_4$NClO$_4$ as an electrolytic solution. Immediately after construction, the cell had a voltage of 0 V. When a voltage was applied to the cell from an external power supply to dope the positive electrode with ClO$_4$$^-$ ions and the negative electrode with (C$_2$H$_5$)$_4$N$^+$ ions, the cell showed an electromotive voltage of 3.1 V in 3 hours. The doping speed was adjusted to 1% per hour. Then, at the same speed, these ions were undoped to perform discharging. In about 2.5 hours, the open circuit voltage returned to 0 V.

What is claimed is:

1. An insoluble and infusible substrate with a polyaceene skeletal structure having a hydrogen/carbon atomic ratio from 0.05 to 0.60 and a specific surface area, measured by the BET method, of at least 600 m$^2$/g, said substrate being a heat-treated product of an aromatic condensation polymer consisting of carbon, hydrogen and oxygen, said aromatic condensation polymer being selected from the group consisting of (1) condensation products of aromatic hydrocarbon compounds having a phenolic hydroxyl group with aldehydes, (2) condensation products of a mixture of aromatic hydrocarbon compounds having a phenolic hydroxyl group and aromatic hydrocarbon compounds free of phenolic hydroxyl groups with aldehydes, and (3) furan resins.

2. The substrate of claim 1 wherein the atomatic condensation polymer is a condensation product of an aromatic hydrocarbon compound having a phenolic hydroxyl group and an aldehyde.

3. The substrate of claim 1 wherein the aromatic condensation polymer is a condensation product of phenol and formaldehyde.

4. The substrate of claim 1 wherein the polyacene skeletal structure has a hydrogen/carbon atomic ratio of from 0.05 to 0.5.

5. The substrate of claim 1 wherein the polyacene skeletal structure has a hydrogen/carbon atomic ratio of from 0.15 to 0.60.

6. The material of claim 1 wherein the polyacene skeletal structure has a hydrogen/carbon atomic ratio of from 0.50 to 0.25.

7. The substrate as claimed in claim 1 which has been prepared by mixing said aromatic condensation polymer with a water-soluble inorganic material wherein the weight ratio of said aromatic condensation polymer; said inorganic material is from 100:5 to 100:900, then molding the thus-obtained mixture to obtain a shaped substrate, then curing the shaped substrate, then heating the shaped, cured substrate to a temperature in the range of 350° to 800° C. in a non-oxidizing atmosphere to convert said aromatic condensation polymer to said polyacene skeletal structure, then washing said substrate with water to remove said inorganic material from said substrate and then drying said substrate.

8. The substrate as claimed in claim 7 in which said inorganic material is selected from the group consisting of zinc chloride, sodium phosphate, potassium hydroxide and potassium sulfide.

9. An electrically conductive organic polymeric material comprising (a) an insoluble, infusible substrate with a polyacene skeletal structure having a hydrogen/carbon atomic ratio of from 0.15 to 0.60 and a specific surface area, measured by the BET method, of at least 600 m$^2$/g, said substrate being a heat-treated product of an aromatic condensation polymer consisting of carbon, hydrogen and oxygen, said aromatic condensation polymer being selected from the group consisting of (1) condensation products of aromatic hydrocarbon compounds having a phenolic hydroxyl group with aldehydes, (2) condensation products of a mixture of aromatic hydrocarbon compounds having a phenolic hydroxyl group and aromatic hydrocarbon compounds free of phenolic hydroxyl groups with aldehydes, and (3) furan resins, and (b) an electron donating doping agent, or an electron accepting doping agent, or both; said material having a higher electrical conductivity than the non-doped substrate (a).

10. The material of claim 9 wherein the aromatic condensation polymer is a condensation product of an aromatic hydrocarbon compound having a phenolic hydroxyl group and an aldehyde.

11. The material of claim 9 wherein the aromatic condensation polymer is a condensation product of phenol and formaldehyde.

12. The material of claim 9 which has a direct-current electric conductivity at room temperature of at least $10^{-4}$ ohm$^{-1}$cm$^{-1}$.

13. The material of claim 9 wherein the electron donating doping agent is a metal of Group IA of the periodic table selected from the group consisting of lithium, sodium, potassium, rubidium and cesium.

14. The material of claim 9 wherein the electron accepting doping agent is a halogen selected from the group consisting of fluorine, chlorine, bromine and iodine.

15. The material of claim 9 wherein the electron accepting doping agent is a halogen compound selected from the group consisting of AsF$_5$, PF$_5$, BF$_3$, BCl$_3$ and BBr$_3$.

16. The material of claim 9 wherein the electron accepting doping agent is an oxide of a non-metal element or an anion derived from an inorganic acid.

17. The material of claim 9 which is in the form of a molded article.

18. The material of claim 9 which is in the form of a film, a plate, a fiber or a composite thereof.

19. The material as claimed in claim 9 in which said substrate has been prepared by mixing said aromatic condensation polymer with a water-soluble inorganic material wherein the weight ratio of said aromatic condensation polymer: said inorganic material in the thus-obtained mixture is from 100:5 to 100:900, then molding the thus-obtained mixture to obtain a shaped substrate, then curing the shaped substrate, then heating the shaped, cured substrate to a temperature in the range of 350° to 800° C. in a non-oxidizing atmosphere to convert said aromatic condensation polymer to said polyacene skeletal structure, then washing said substrate with water to remove said inorganic material from said substrate and then drying said substrate.

20. The material as claimed in claim 19 in which said inorganic material is selected from the group consisting of zinc chloride, sodium phosphate, potassium hydroxide and potassium sulfide.

21. An organic cell comprising a positive electrode, a negative electrode and an electrolytic solution, one or both of said positive and negative electrodes being composed of an insoluble and infusible substrate with a polyacene skeletal structure having a hydrogen/carbon atomic ratio of from 0.05 to 0.50 and a specific surface area, measured by the BET method, of at least 600 m$^2$/g, said substrate being a heat-treated product of an aromatic condensation polymer consisting of carbon, hydrogen and oxygen, said aromatic condensation polymer being selected from the group consisting of (1) condensation products of aromatic hydrocarbon compounds having a phenolic hydroxyl group with aldehydes, (2) condensation products of a mixture of aromatic hydrocarbon compounds having a phenolic hydroxyl group and aromatic hydrocarbon compounds free of phenolic hydroxyl groups with aldehydes, and (3) furan resins, and said electrolytic solution being a solution in an aprotic organic solvent of a compound capable of forming ions which can dope said electrode by electrolysis.

22. The organic cell of claim 21 wherein the aromatic condensation polymer is a condensation product of an aromatic hydrocarbon compound having a phenolic hydroxyl group and an aldehyde.

23. The organic cell of claim 21 wherein the aromatic condensation polymer is a condensation product of phenol and formaldehyde.

24. The organic cell of claim 21 wherein the hydrogen/carbon atomic ratio is from 0.1 to 0.35.

25. The organic cell of claim 21 wherein said positive electrode is composed of said insoluble and infusible substrate and said negative electrode is composed of an alkali metal or an alkaline earth metal.

26. The organic cell of claim 21 wherein the negative electrode is composed of lithium.

27. The organic cell of claim 21 wherein said compound capable of forming dopable ions is LiI, NaI, NH$_4$I, LiClO$_4$, LiAsF$_6$, LiBF$_4$, KPF$_6$, NaPF$_6$, (C$_2$H$_5$)$_4$NClO$_4$, (n-C$_4$H$_9$)$_4$NClO$_4$, (n-C$_4$H$_9$)$_4$NAsF$_6$, (n-C$_4$H$_9$)$_4$PF$_6$ or LiHF$_2$.

28. The organic cell of claim 21 wherein the aprotic organic solvent is ethylene carbonate, propylene carbonate, gamma-butyrolactone, dimethylformamide, dimethylacetamide, dimethyl sulfoxide, acetonitrile, dimethoxyethane, tetrahydrofuran or methylene chloride.

29. The organic cell of claim 21 wherein the insoluble and infusible substrate is in the form of a film, a plate, a porous plate, a fiber, a woven fabric, a non-woven fabric, or a composite thereof.

30. The organic cell as claimed in claim 21 in which the substrate has been prepared by mixing said aromatic condensation polymer with a water-soluble inorganic material wherein the weight ratio of said aromatic condensation polymer: said inorganic material is from 100:5 to 100:900, then molding the thus-obtained mixture to obtain a shaped substrate, then curing the shaped substrate, then heating the shaped, cured substrate to a temperature in the range of 350° to 800° C. in a non-oxidizing atmosphere to convert said aromatic condensation polymer to said polyacene skeletal structure, then washing said substrate with water to remove said inorganic material from said substrate and then drying said substrate.

31. The organic cell as claimed in claim 30 in which said inorganic material is selected from the group consisting of zinc chloride, sodium phosphate, potassium hydroxide and potassium sulfide.

* * * * *